(12) United States Patent
Labuschagne et al.

(10) Patent No.: US 7,940,054 B2
(45) Date of Patent: May 10, 2011

(54) SYSTEM AND METHOD TO ZERO-SEQUENCE VERIFY GROUND RETURN PATH INTEGRITY BY COMPARING MEASURED ZERO-SEQUENCE CURRENT IN AN AUTOTRANSFORMER WITH A SECOND ZERO-SEQUENCE CURRENT SOURCE

(75) Inventors: Casper A. Labuschagne, Pullman, WA (US); Normann Fischer, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 1241 days.

(21) Appl. No.: 11/582,254

(22) Filed: Oct. 16, 2006

(65) Prior Publication Data
US 2008/0088466 A1    Apr. 17, 2008

(51) Int. Cl.
*G01R 31/14* (2006.01)
(52) U.S. Cl. .......... 324/509; 340/649; 361/42; 323/240; 323/255; 336/188
(58) Field of Classification Search .................. 324/509; 361/35; 340/649
See application file for complete search history.

(56) References Cited

U.S. PATENT DOCUMENTS

| | | | | |
|---|---|---|---|---|
| 4,020,438 A | * | 4/1977 | Manimalethu | 336/5 |
| 4,156,185 A | * | 5/1979 | Kelley et al. | 324/107 |
| 4,231,074 A | * | 10/1980 | McNutt et al. | 361/44 |
| 4,772,978 A | * | 9/1988 | Oura et al. | 361/36 |
| 5,115,226 A | | 5/1992 | Schweitzer | |
| 5,574,356 A | * | 11/1996 | Parker | 323/207 |
| 5,790,356 A | * | 8/1998 | Bottrell et al. | 361/35 |
| 5,963,404 A | | 10/1999 | Guzman | |
| 6,025,980 A | * | 2/2000 | Morron et al. | 361/42 |
| 6,417,651 B1 | * | 7/2002 | Kronberg | 323/255 |
| 6,573,726 B1 | | 6/2003 | Roberts | |
| 6,721,671 B2 | * | 4/2004 | Roberts | 702/58 |
| 6,747,458 B2 | * | 6/2004 | Huber et al. | 324/527 |
| 6,785,105 B2 | | 8/2004 | Roberts | |
| 6,844,736 B2 | * | 1/2005 | Weems | 324/509 |
| 7,279,905 B2 | * | 10/2007 | Cvorovic | 324/522 |
| 7,345,488 B2 | * | 3/2008 | Fischer | 324/521 |
| 2003/0197989 A1 | * | 10/2003 | Nojima | 361/47 |
| 2007/0021937 A1 | | 1/2007 | Labuschagne | |

OTHER PUBLICATIONS

Zoran Gajic, Igor Ivankovic, Bozidar Filipovic-Grcic, Renata Rubesa, New Method for Differential Protection of Phase Shifting Transformers, Sep. 6, 2006.
Casper Labuschgagne, Normann Fischer, Transformer Fault Analysis Using Event Oscillography, Sep. 15, 2006.
Edmund O. Schweitzer, III Ph.D and Stanley E. Zocholl from Schweitzer Engineering Laboratories, Inc. in Pullman, WA USA; Introduction To Symmetrical Components; Copyright SEL 1997, 1999, 2004 (15 pages).

* cited by examiner

*Primary Examiner* — Timothy J Dole
*Assistant Examiner* — Benjamin M Baldridge
(74) *Attorney, Agent, or Firm* — Eugene M. Cummings, P.C.

(57) ABSTRACT

A ground return path is determined to be impaired when no zero-sequence current is measured in the neutral return path, but zero-sequence current is detected in other suitable measuring points that include the windings of an autotransformer, or in a magnetically coupled delta-configured tertiary winding, or potential transformer.

15 Claims, 6 Drawing Sheets

SYSTEM AND METHOD TO ZERO-SEQUENCE VERIFY GROUND RETURN PATH INTEGRITY BY COMPARING MEASURED ZERO-SEQUENCE CURRENT IN AN AUTOTRANSFORMER WITH A SECOND ZERO-SEQUENCE CURRENT SOURCE

CROSS-REFERENCE TO RELATED APPLICATIONS

None.

FIELD OF THE INVENTION

The present invention relates generally to a system and method for validating the integrity of a ground return path in power systems, and more particularly to methods of validating the integrity of a ground return path in power systems including an autotransformer.

DESCRIPTION OF THE PRIOR ART

Autotransformers are frequently used in power systems to interconnect systems operating at different voltages. For example a transmission system operating at 138 kV can be connected to a distribution system operating at 66 kV using an autotransformer. In addition, autotransformers are frequently used to adapt voltage levels when connecting industrial machinery. For example, an autotransformer can be used to connect industrial equipment designed to operate at 480V to a local 600V supply.

An autotransformer is an electrical transformer with only one winding, which is tapped at points along the winding. A high voltage input is connected to the high voltage terminal of the autotransformer, and a low voltage tap is disposed somewhere between the high voltage tap and a neutral tap, which is normally grounded. A tertiary delta winding provides an ampere-turns balance for zero-sequence current to flow during system faults that include ground, thereby avoiding the tank of the autotransformer providing the ampere-turns balance. In many cases where a tertiary winding is present, the current in each phase of the delta is acquired for measurement.

Ground faults can create safety risks within power systems when the ground return path of the power system is impaired. The ground return path can have many components. For instance, a ground return path can comprise ground wires coupled to overhead power lines, metal sheaths around power cables, station grounding mats, and the earth itself. When the ground return path is impaired and a ground fault occurs, a "grounded" surface may be brought to a dangerous voltage level, depending on the location of the impairment and the location of the grounded surface.

Theoretically, it is possible to measure ground return path impairment by measuring the impedance to ground at various locations. However, this has proven to be impractical, given the number of different measurement points required.

OBJECTS OF THE INVENTION

Accordingly, it is an object of this invention to provide a practical method for detecting ground return path impairment during a ground fault in power systems using a grounded autotransformer.

SUMMARY OF THE INVENTION

The disclosed invention achieves its objective by observing the presence or lack of zero-sequence current in a neutral return path of a three-phase autotransformer when zero-sequence current is detected in either the primary windings of the autotransformer or in the windings of a magnetically coupled tertiary delta-configured winding. Where a tertiary delta winding is present, zero-sequence current is measured in the delta-configured winding and the neutral return path of the autotransformer. If zero-sequence current is detected in the tertiary winding, but not in the neutral return path, the ground return path is determined to be impaired.

Alternatively, in autotransformers where no tertiary delta winding is present, zero-sequence current is measured in the neutral return path, and in each of the windings of the autotransformer. If zero-sequence current is present in the windings of the autotransformer, but zero-sequence current is not detected in the neutral return path, the ground return path is determined to be impaired.

BRIEF DESCRIPTION OF THE DRAWINGS

Although the characteristic features of this invention will be particularly pointed out in the claims, the invention itself, and the manner in which it can be made and used, can be better understood by referring to the following description taken in connection with the accompanying drawings forming a part hereof, wherein like reference numerals refer to like parts throughout the several views and in which:

DETAILED DESCRIPTION OF THE ILLUSTRATED EMBODIMENTS

Figure 1:
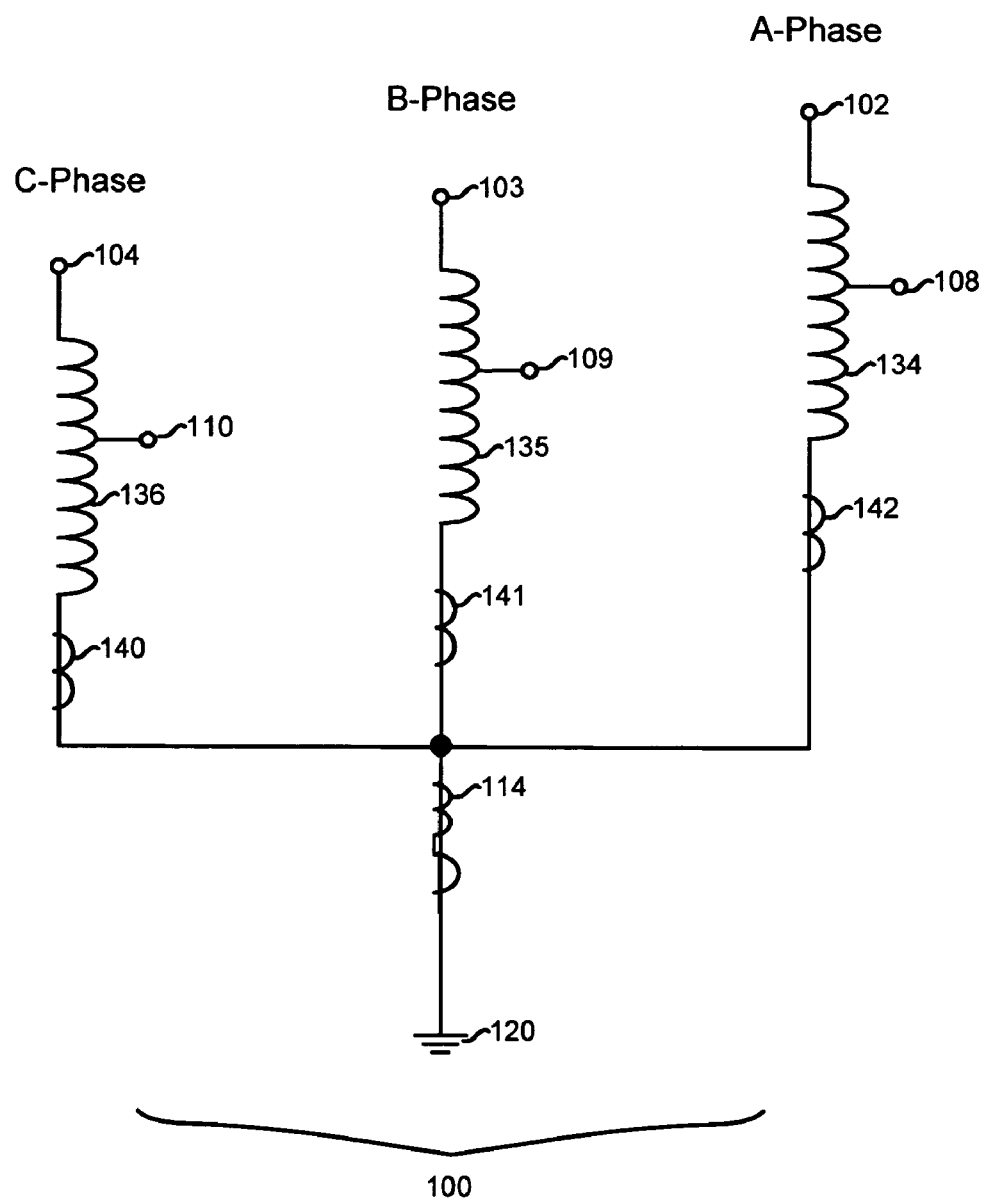
FIG. 1 depicts a three-phase autotransformer with a current transformer installed to measure current in the ground return path of the autotransformer.

Referring to the Figures, and in particular to FIG. 1, a three-phase autotransformer 100 is depicted. Phases A, B, and C each have a separate winding 134-136 on the transformer. Each winding has a high voltage terminal 102-104 and a low voltage tap 108-110. In addition, each winding is coupled to a current transformer 140-142, and a current transformer 114 is also coupled to the neutral return path of the autotransformer. Finally, the return path is connected to ground 120 to form a low-impedance ground return path for system faults that include ground.

Figure 2:
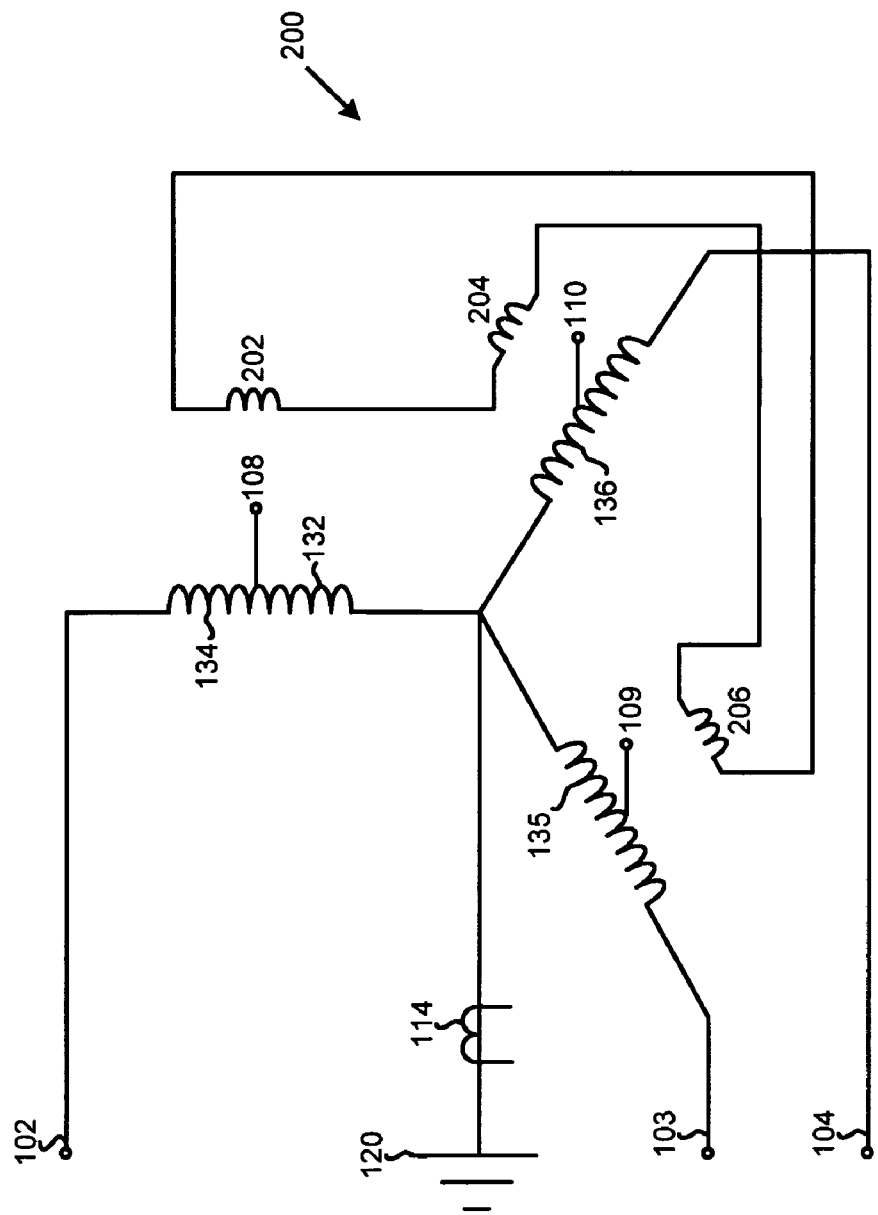
FIG. 2 depicts a three-phase autotransformer with a tertiary delta winding.

FIG. 2 depicts a three-phase autotransformer 100 with a magnetically coupled tertiary winding 200. The tertiary winding 200 includes three windings 202, 204, 206 configured as a delta.

Figure 3A:
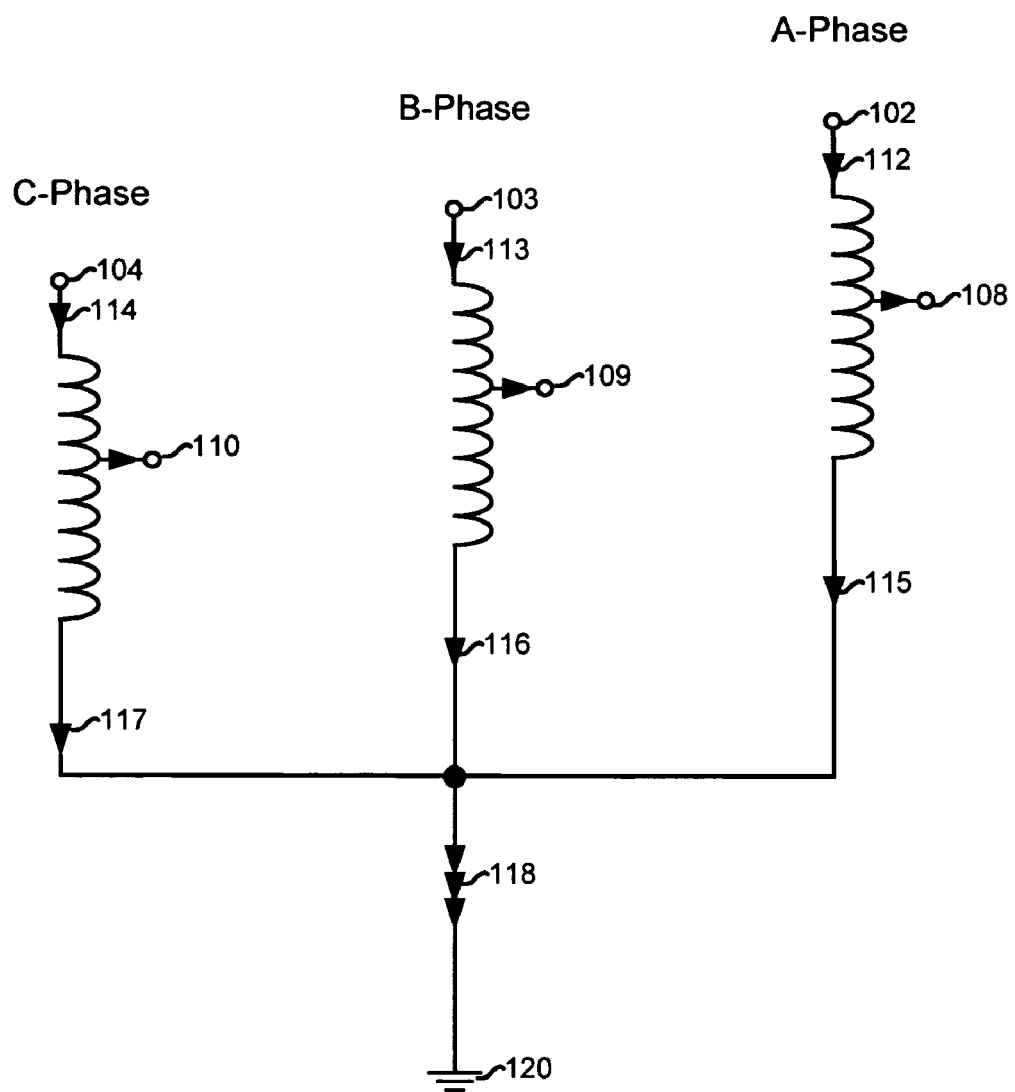
FIG. 3A depicts zero-sequence current flow in a three-phase autotransformer during a ground fault, where the ground return path is intact.
Figure 3B:
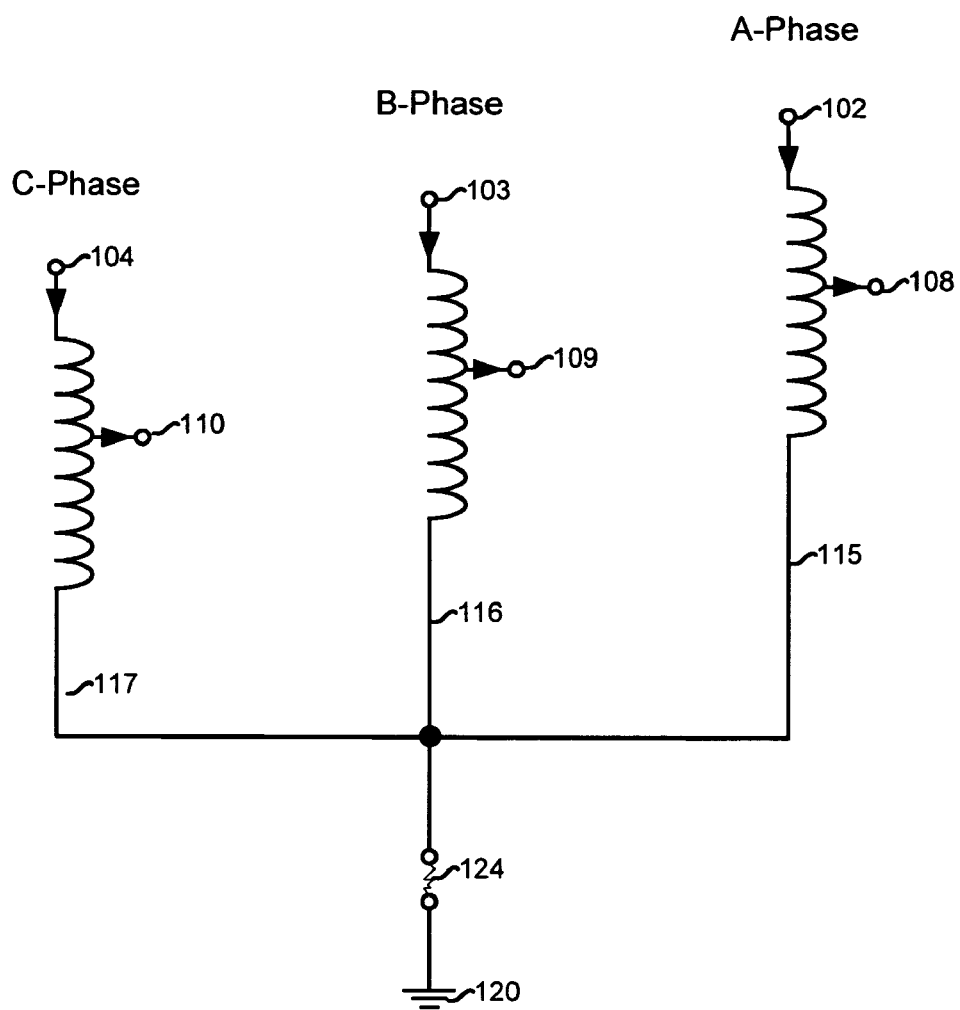
FIG. 3B depicts zero-sequence current flow in a three-phase autotransformer during a ground fault, where the ground return path is impaired.

FIG. 3A depicts the flow of zero-sequence current during a ground fault in a three-phase autotransformer with a healthy ground return path. When the ground path is not impaired, zero-sequence current 112-114 should be detected in the high voltage windings 102-104. In addition, zero-sequence current 115-117 should be detected in the low voltage windings 108-110. Finally, zero-sequence current 118 should also be detected in the neutral return path. However, when the ground return path is impaired, as shown FIG. 3B, zero-sequence current will not be detected in the neutral return path. There are many possible causes of the return path impairment 124. For instance, a grounding mat located at a power substation including the autotransformer may have corroded over time.

Figure 4A:
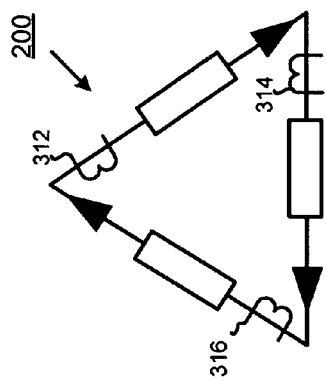
FIG. 4A depicts zero-sequence current flow in a three-phase autotransformer with a tertiary delta winding during a ground fault, where the ground return path is intact.
Figure 4A:
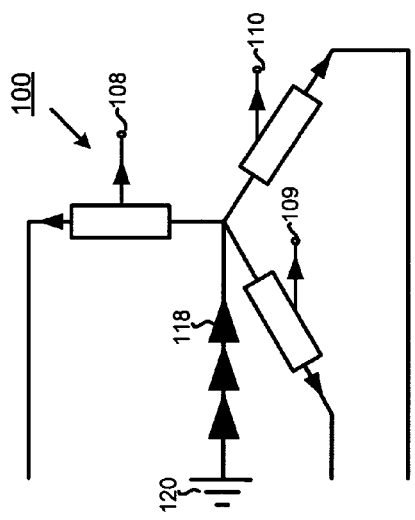
Figure 4B:
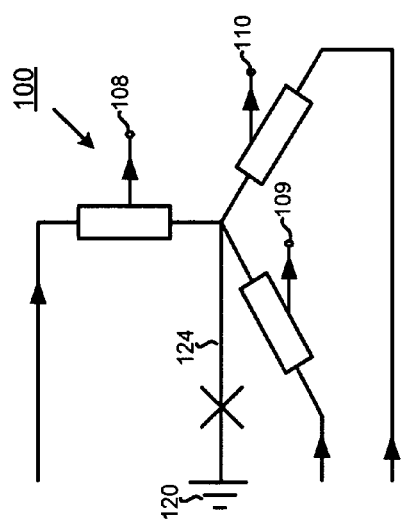
FIG. 4B depicts zero-sequence current flow in a three-phase autotransformer with a tertiary delta winding during a ground fault, where the ground return path is impaired.

FIG. 4A depicts the flow of zero-sequence current during a ground fault in a three-phase autotransformer with a healthy ground return path, Both the ground return path and a magnetically coupled tertiary winding 200 are illustrated. As shown, the tertiary winding 200 includes current transformers 312, 314, and 316 coupled to each phase in the delta. Alternatively, a single current transformer could be used. With an intact ground, zero-sequence current 118 should be measured in the neutral return path of the autotransformer 100 as well as in each phase of the tertiary winding 200. However, when the ground return path of the autotransformer 100 is impaired, as shown in FIG. 4B, no zero-sequence current is detected in the neutral return path.

Figure 5A:
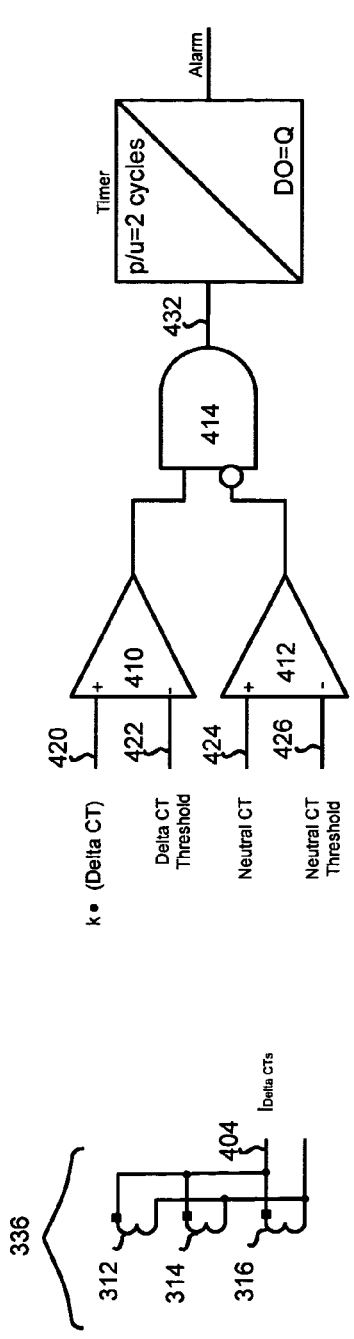
FIG. 5A is a logic diagram showing one possible circuit for implementing the disclosed invention.

FIG. 5A depicts a simplified circuit embodying the principles of the disclosed invention, which can be used when only one current transformer is disposed within the tertiary winding, or when a separate current transformer is used in each phase of the tertiary winding and both ends of the three current transformers are connected in wye 336. The output of the wye 404 is scaled by a scale factor k to arrive at signal 420, which is compared against a threshold 422. In addition, the acquired neutral current of the autotransformer 100 return path from the current transformer 114 is converted to a signal 424 and compared against a second threshold 426. If signal 420 exceeds threshold 422 and signal 424 fails to exceed threshold 426, alarm signal 432 is produced.

Figure 5B:
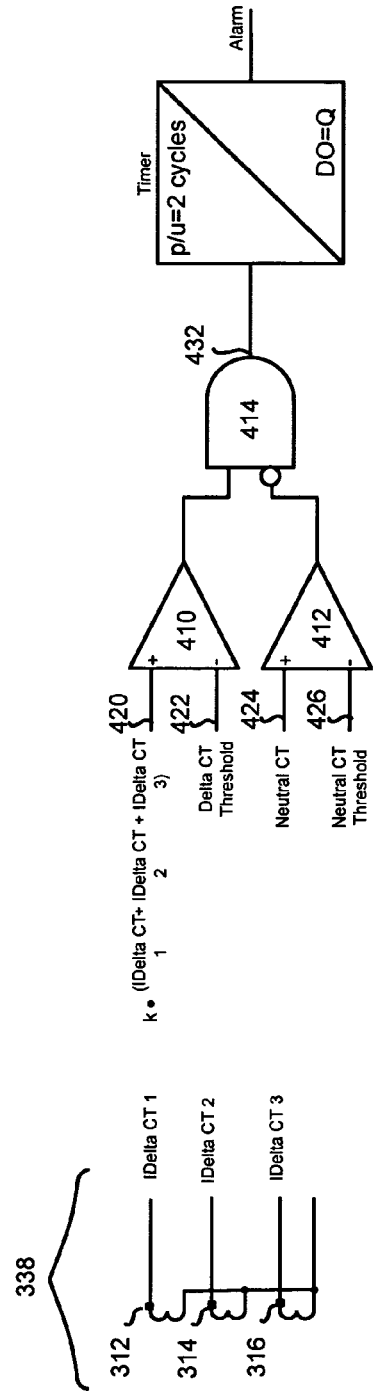
FIG. 5B is a logic diagram showing one possible circuit for implementing the disclosed invention.

FIG. 5B depicts a simplified circuit embodying the principles of the disclosed invention, which can be used when a separate current transformer is disposed in each phase of the tertiary winding, and only one end of each current transformer is connected in wye 338. In this case, the signal level of each current transformer 312, 314, and 316 must be summed, before being scaled by a scale factor k to produce signal 420. Aside from this modification, the circuit of FIG. 5B works similarly to the circuit depicted in FIG. 5A.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

We claim:

1. A method for verifying the integrity of a ground return path of a power system coupled to a three-phase autotransformer, the method comprising the steps of:
    i) measuring zero-sequence current in a winding of the three-phase autotransformer;
    ii) determining if the zero-sequence current in the winding is above a first threshold;
    iii) measuring zero-sequence current in a neutral path of the three-phase autotransformer;
    iv) determining if the zero-sequence current in the neutral path is above a second threshold; and,
    v) determining that the ground return path is impaired when the zero-sequence current in the winding is above the first threshold and the zero-sequence current in the neutral path is not above the second threshold.

2. The method of claim 1, wherein the winding is either a primary winding or a delta-configured tertiary winding.

3. A method for verifying the integrity of a ground return path of a power system coupled to a three-phase autotransformer including a delta-configured tertiary winding and a neutral return path, the method comprising the steps of:
    i) measuring zero-sequence current in the delta-configured winding;
    ii) determining if the zero-sequence current in the delta-configured winding is above a first threshold;
    iii) measuring zero-sequence current in the neutral path;
    iv) determining if the zero-sequence current in the neutral path is above a second threshold; and,
    v) determining that the ground return path is impaired when the zero-sequence current in the delta-configured winding is above the first threshold and the zero-sequence current in the neutral path is not above the second threshold.

4. The method of claim 3, wherein the step of determining if the zero-sequence current in the delta-configured winding is above a first threshold is fulfilled by determining if the zero-sequence current in the delta-configured winding is above a first threshold for a first predetermined time period.

5. The method of claim 3, wherein the step of determining if the zero-sequence current in the neutral path is above a second threshold is fulfilled by determining if the zero-sequence current in the neutral path is above a second threshold for a second predetermined time period.

6. The method of claim 3, wherein the delta-configured winding of the autotransformer further comprises a single-current transformer disposed in one of the windings.

7. The method of claim 3, wherein the delta-configured winding of the autotransformer further comprises three current transformers, wherein each of the current transformers is disposed in a separate winding of the delta-configured winding.

8. A method for verifying the integrity of a ground return path of a power system coupled to a three-phase autotransformer including a winding for each phase and a neutral path, the method comprising the steps of:
    i) measuring zero-sequence current in the winding of each phase;
    ii) determining if the zero-sequence current in the winding of each phase is above a first threshold;
    iii) measuring zero-sequence current in the neutral path;
    iv) determining if the zero-sequence current in the neutral path is above a second threshold; and,
    v) determining that the ground return path is impaired when the zero-sequence current in the winding of each phase is above the first threshold and the zero-sequence current in the neutral path is not above the second threshold.

9. The method of claim 8, wherein the step of determining if the zero-sequence current in the winding of each phase is above a first threshold is fulfilled by determining if the zero-sequence current in the winding of each phase is above a first threshold for a first predetermined time period.

10. The method of claim 8, wherein the step of determining if the zero-sequence current in the neutral path is above a second threshold is fulfilled by determining if the zero-sequence current in the neutral path is above a second threshold for a second predetermined time period.

11. A system for verifying the integrity of a ground return path of a power system coupled to a three-phase autotransformer including a delta-configured tertiary winding and a neutral return path, the system comprising:
   i) at least one current transformer disposed within a leg of the delta-configured tertiary winding for measuring zero-sequence current within the delta-configured tertiary winding;
   ii) a first logic circuit coupled to the current transformer for asserting a first signal when the measured zero-sequence current within the delta-configured tertiary winding exceeds a first threshold;
   iii) a second current transformer disposed within the neutral return path for measuring zero-sequence current within the neutral return path;
   iv) a second logic circuit coupled to the second current transformer for asserting a second signal when the measured zero-sequence current within the neutral return path exceeds a second threshold;
   v) a ground path impairment detection circuit coupled to the first logic circuit and the second logic circuit for producing a ground path impairment signal when the first signal is asserted and the second signal is not asserted; and,
   vi) an alarm circuit coupled to the ground path impairment detection circuit for producing an alarm when the ground path impairment signal is asserted.

12. The system of claim 11, wherein said current transformer consists of three current transformers, each disposed in a leg of the delta-configured tertiary winding.

13. A system for verifying the integrity of a ground return path of a power system coupled to a three-phase autotransformer having a number of tap positions, each associated with a voltage level, including a current transformer for each phase and a current transformer for the neutral path, the system comprising:
   i) means for measuring zero-sequence current of each voltage level;
   ii) means for determining if the zero-sequence current of each voltage level is above a first threshold;
   iii) means for measuring zero-sequence current in the neutral path;
   iv) means for determining if the zero-sequence current in the neutral path is above a second threshold and,
   v) means for determining that the ground return path is impaired when the zero-sequence current of each voltage level is above the first threshold and the zero-sequence current in the neutral path is not above the second threshold.

14. A system for verifying the integrity of a ground return path of a power system coupled to a three-phase autotransformer including a delta-configured tertiary winding, the system comprising:
   i) means for measuring zero-sequence current in the delta-configured winding;
   ii) means for determining if the zero-sequence current in the delta-configured winding is above a first threshold;
   iii) means for measuring zero-sequence current in the neutral path;
   iv) means for determining if the zero-sequence current in the neutral path is above a second threshold; and,
   v) means for determining that the ground return path is impaired when the zero-sequence current in the delta-configured winding is above the first threshold and the zero-sequence current in the neutral path is not above the second threshold.

15. A system for verifying the integrity of a ground return path of a power system coupled to a three-phase autotransformer including a current transformer disposed in a neutral path of the autotransformer, and a potential transformer, the system comprising:
   i) means for measuring zero-sequence voltage in the potential transformer;
   ii) means for determining if the zero-sequence voltage in the potential transformer is above a first threshold;
   iii) means for measuring zero-sequence current in the neutral path;
   iv) means for determining if the zero-sequence current in the neutral path is above a second threshold; and,
   v) means for determining that the ground path is impaired when the zero-sequence voltage in the potential transformer is above the first threshold and the zero-sequence current in the neutral path is not above the second threshold.

* * * * *